United States Patent [19]

Tseng

[11] Patent Number: 5,792,693
[45] Date of Patent: Aug. 11, 1998

[54] METHOD FOR PRODUCING CAPACITORS HAVING INCREASED SURFACE AREA FOR DYNAMIC RANDOM ACCESS MEMORY

[75] Inventor: Horng-Huei Tseng, Hsinchu, Taiwan

[73] Assignee: Vanguard International Semiconductor Corporation, Hsin-Chu, Taiwan

[21] Appl. No.: 813,721

[22] Filed: Mar. 7, 1997

[51] Int. Cl.$^6$ ............................................. H01L 21/8242
[52] U.S. Cl. ............................................. 438/254; 438/397
[58] Field of Search ............................... 438/238, 239, 438/253, 254, 255, 381, 396, 397, 398; 257/306, 307, 309

[56] References Cited

U.S. PATENT DOCUMENTS

| | | | |
|---|---|---|---|
| 5,468,670 | 11/1995 | Ryou | 437/52 |
| 5,482,886 | 1/1996 | Park et al. | 438/238 |
| 5,491,103 | 2/1996 | Ahn et al. | 438/238 |
| 5,552,334 | 9/1996 | Tseng | 437/52 |
| 5,710,075 | 1/1998 | Tseng | 438/254 |

*Primary Examiner*—Joni Chang
*Attorney, Agent, or Firm*—George O. Saile; Stephen B. Ackerman

[57] ABSTRACT

A method for manufacturing an array of stacked capacitors with increased capacitance on a dynamic random access memory (DRAM) device was achieved. The invention uses a thermal oxidation and anisotropic plasma etch to form sidewall spacers in a recess or trench in a first polysilicon layer over the capacitor node contacts to the FETs. The recesses within the sidewall spacers are then filled with a second polysilicon layer and chem/mech polished back to form studs. The sidewall spacers are then selectively removed by a wet etch and a patterned second photoresist layer is used to pattern the first polysilicon layer into an array of capacitor bottom electrodes with vertical portions that increase the surface area. An interelectrode dielectric layer is formed on the bottom electrodes and a third polysilicon layer is deposited and patterned to form the top electrodes and to complete the array of stacked capacitors on the DRAM device.

21 Claims, 6 Drawing Sheets

5,792,693

METHOD FOR PRODUCING CAPACITORS HAVING INCREASED SURFACE AREA FOR DYNAMIC RANDOM ACCESS MEMORY

BACKGROUND OF THE INVENTION (1) Field of the Invention

The present invention relates to integrated circuits on semiconductor substrates, and more particularly to a method for fabricating stacked capacitors with increased surface area on arrays of dynamic random access memory (DRAM) cells thereby increasing capacitance.

(2) Description of the Prior Art

The memory cell density on dynamic random access memory (DRAM) made on semiconductor substrates continues to increase. For example, after the year 2000 the array of memory cells on DRAM chips that store binary data is expected to be greater than a 1.0 gigabits. The increase in cell density has resulted from the downsizing of the individual semiconductor devices and the resulting increase in device packing density. This reduction in device size is a result of advances in high resolution photolithography, patterning by directional (anisotropic) plasma etching, and other semiconductor technology innovations, such as the use of self-aligning techniques. However, this reduction in device size is putting additional demand on the semiconductor processing technologies, and more specifically on the device electrical requirements, and more particularly on devices such as the DRAM device.

These DRAM devices consist in part of an array of individual DRAM storage cells that store binary data (bits) as electrical charge on a storage capacitor. Further, the information is stored and retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor or built over the FET in the cell area as a stacked capacitor.

With this rapid increase in the number of memory cells on the DRAM chip, there is a strong need to maintain a reasonable chip size with improved circuit performance. Therefore it is necessary to further reduce the area occupied by the individual cells on the DRAM chip. Unfortunately, as the cell size decreases, it becomes increasing difficult to fabricate storage capacitors with sufficient capacitance to store the necessary charge to provide an acceptable signal-to-noise level for the read circuits (sense amplifiers) to detect. The reduced charge also necessitates increasing the refresh cycle frequency that periodically restores the charge on these volatile storage cells. This further reduces the performance of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface.

In recent years the method of choice is to build stacked capacitors over the pass transistors within each cell area rather than forming trench capacitors which are etched in the substrate. This provides increased latitude in capacitor design while reducing cell area. More specifically the stacked capacitors can be built in the vertical extensions (third dimension) to increase the stacked capacitor area and therefore the capacitance.

Various three-dimensional stacked storage capacitor structures have been reported in the literature for increasing the capacitance. For example, Tseng, U.S. Pat. No. 5,552,334, describes a method for making a Y-shaped capacitor in a DRAM cell. The method employs a recessed photoresist layer to form a Y-shaped bottom electrode for the stacked capacitor that is self-aligned to the node contact. Another method for making a stacked capacitor having a double-cylindrical structure is described by Ryou in U.S. Pat. No. 5,468,670. The method employs two photoresist masking levels and a liquid-phase deposition of oxide to form a bottom electrode having a double-cylindrical shape.

However, as the DRAM cell continues to decrease in size, it would be desirable to further simplify the process by reducing the number of processing steps, and incorporating self-aligning techniques to minimize the ground rule tolerances, and to increase cell density while increasing capacitor area and reducing manufacturing costs.

SUMMARY OF THE INVENTION

Therefore a principal object of the present invention is to provide a method for fabricating stacked storage capacitors having increased surface areas for increased capacitance.

It is another object of this invention to form the bottom electrodes for these stacked storage capacitors using only two photoresist masking steps to make capacitor bottom electrodes having vertical extending portions that increase capacitance.

Still another object of the present invention is to fabricate these stacked storage capacitors using a thermal oxidation in a recess of a polysilicon layer to form self-aligned, closely spaced vertical portions on the bottom electrodes that exceed the resolution limits of the current photolithography.

The method for fabricating an array of these dynamic random access memory (DRAM) cells begins by first forming an array of device areas on a semiconductor substrate. Typically the substrate is a single crystal silicon substrate doped with a P-type conductive dopant, such as boron (B). The device areas are formed by forming a relatively thick Field OXide (FOX) surrounding and electrically isolating each device area. One method of forming these field oxide areas is by protecting the substrate surface from oxidation where device areas are desired. This is achieved by depositing an oxidation barrier layer, such as a silicon nitride (Si3N4) layer, and patterning the Si3N4 leaving portions over the device areas. The exposed field oxide areas on the silicon substrate are then thermally oxidized to form the FOX. This method is typically referred to in the semiconductor industry as the LOCal Oxidation of Silicon (LOCOS) method. After removing the silicon nitride layer a thin gate oxide is formed in the device areas on the silicon substrate. A polysilicon layer or polycide (polysilicon/silicide) layer, hereafter referred to as the polycide layer, having a cap oxide (SiO2) thereon is patterned to form the FET gate electrodes, and the interconnecting word lines for the DRAM cells. Lightly doped source/drain areas are formed adjacent to the gate electrodes, usually by ion implantation of an N-type dopant, such as arsenic (As) or phosphorus (P), and then sidewall spacers are formed on the gate electrode sidewalls, by depositing a conformal insulating (SiO2) layer and anisotropically etching back the layer to the substrate surface. The FETs are then completed by using a second N-type dopant implant to provide heavily doped areas to form the FET source/drain contact areas adjacent to the sidewall spacers.

A first insulating layer, such as silicon oxide is deposited on the substrate and planarized. For example, the first insulating layer can be globally planarized by chemical/ mechanical polishing. A silicon nitride (Si3N4) layer is then deposited on the first insulating layer. Contact openings are then etched in the silicon nitride layer and first insulating layer to one of the two source/drain contact areas of each FET in the array of memory cells to form node contact openings for the stacked capacitors.

Now by the method of this invention, the stacked capacitors are formed by first depositing a relatively thick N+ doped first polysilicon layer that makes electrical node contact to the source/drain contact areas in the node contacts openings. The N+ doped first polysilicon layer is also planar since it is deposited on the underlying planar first insulating layer, and also completely fills the node contact openings. The portion of the N+ doped first polysilicon layer in the node contact openings forms low resistance ohmic node contacts for the capacitors.

A second insulating layer composed of silicon nitride (Si3N4) is deposited on the first polysilicon layer. A first photoresist masking layer is then patterned by conventional photolithographic techniques, and an anisotropic plasma etch is used to form openings in the silicon nitride layer, and the etching is continued to form recesses (trenches) in the first polysilicon layer over the node contact openings. The recesses are etched having essentially vertical sidewalls.

Now continuing with the method of this invention, a thermal oxide is grown on the exposed sidewall surfaces of the first polysilicon layer in the recesses providing sidewall spacers composed of polysilicon oxide. By the nature of the oxidation, the sidewall spacers extend partially into the recessed areas. The silicon nitride layer serves as an oxidation mask during the thermal oxidation, and is selectively removed after the thermal oxidation using a hot phosphoric acid etch. Anisotropic plasma etching, such as high-density plasma or reactive ion etching and an etchant gas such as trifluoromethane (CHF3) is then used to etch the polysilicon oxide on the bottom surfaces in the recessed areas. This results in polysilicon oxide sidewall spacers remaining on the sidewalls of the recesses that will later serve to self-align a polysilicon stud that will be formed in the recesses. A conformal second polysilicon layer is deposited and fills the recessed areas adjacent to the polysilicon oxide sidewall spacers in the first polysilicon layer. The second polysilicon layer is then chemical/mechanically polished to the surface of the first polysilicon layer, thereby forming polysilicon studs in the recessed areas aligned to the sidewalls of the first polysilicon layer by the presence of the sidewall spacers. A second photoresist etch mask is now formed over the desired capacitor areas, which include the sidewall spacers, to define the outer perimeter of the bottom electrodes for the stacked capacitors. The first polysilicon layer is then anisotropically plasma etched to the silicon nitride layer on the first insulating layer to form an array of bottom electrodes. The insulating sidewall spacers formed from polysilicon oxide are then selectively removed by etching in a hydrofluoric (HF) acid etch solution, thereby leaving bottom electrodes having vertical portions formed from the first and second polysilicon layers. The silicon nitride layer on the first insulating layer serves as an etch stop layer when the spacers are removed in HF. The array of stacked capacitors is now completed by forming an interelectrode dielectric layer on the bottom electrodes and by depositing and patterning a third polysilicon layer to form the top electrodes for the stacked capacitors.

Alternatively, a second embodiment of this invention consists of removing the polysilicon oxide sidewall spacers prior to patterning the first polysilicon layer to form the array of capacitor bottom electrodes. This eliminates the need for the silicon nitride layer on the first insulating layer, thereby reducing the number of process steps. The remaining process steps are identical to the first embodiment.

BRIEF DESCRIPTION OF THE DRAWINGS

The objects and advantages of this invention are best understood with reference to the attached drawings in FIGS. 1 through 11, and the embodiments that follow.

FIGS. 1 through 11 show schematic cross-sectional views for one of the cell regions of an array of DRAM cells illustrating the fabrication steps for a DRAM cell having the stacked storage capacitor with increased surface area by the method of this invention. The sequence of process steps depicted in FIGS. 1-7 including FIG. 8A and FIGS. 9-11 are for the first embodiment, while the sequence of steps shown in FIGS. 1-7 including FIG. 8B and FIGS. 10-11 depicts an alternative process method by a second embodiment.

DESCRIPTION OF THE PREFERRED EMBODIMENTS

Figure 6:
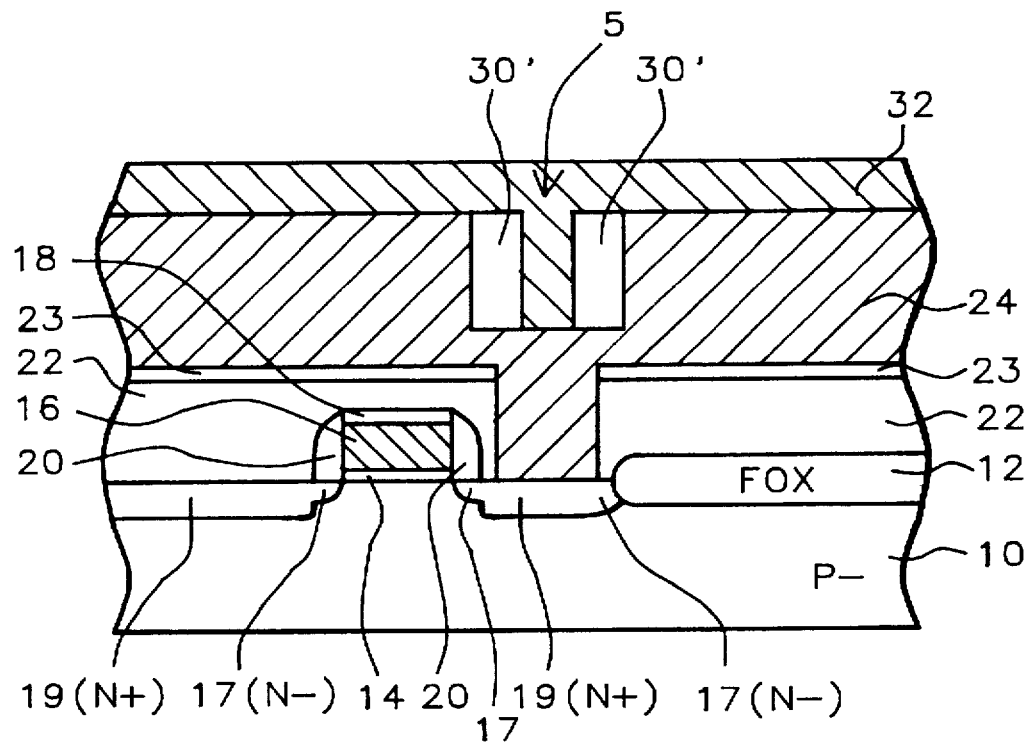
Figure 7:
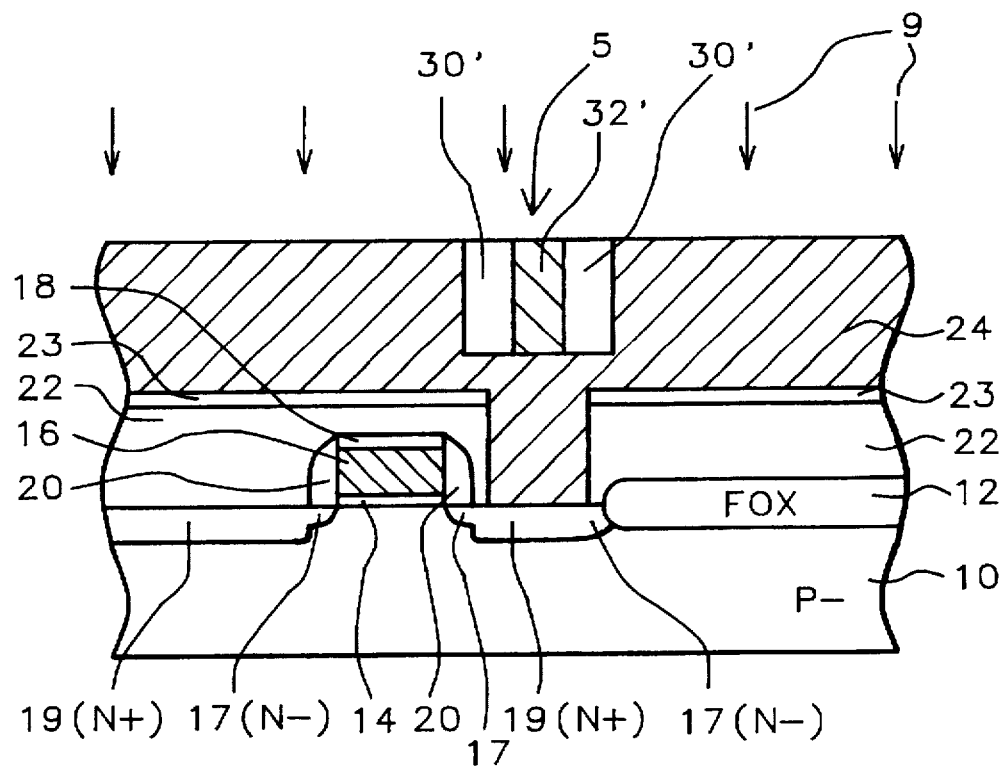
Figure 8A:
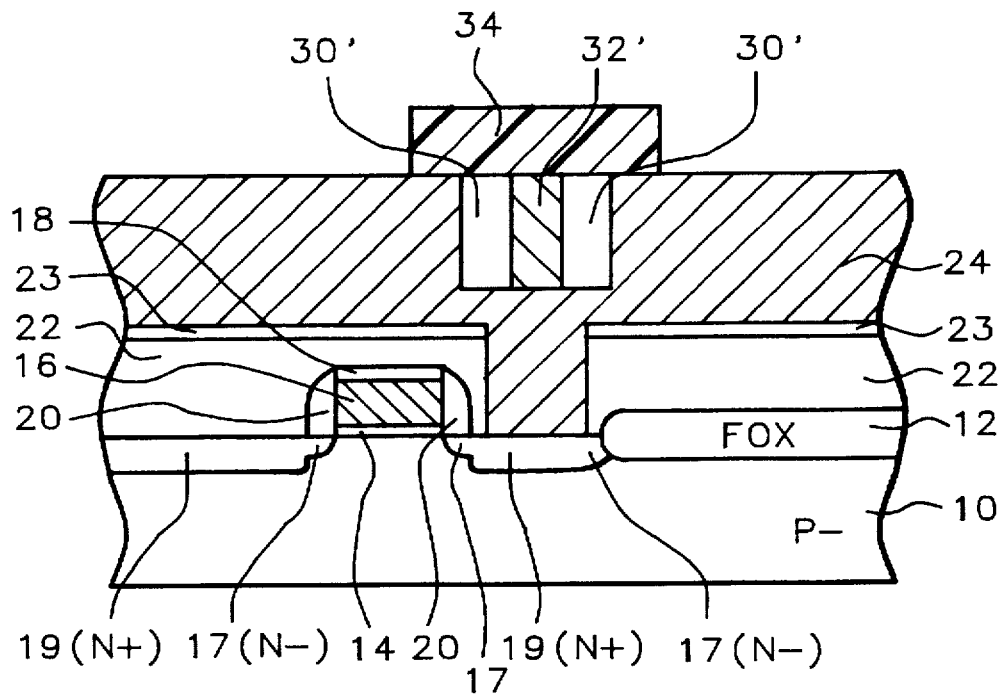

Referring now more particularly to FIGS. 1 through 11, and including FIG. 8A, there is shown a first embodiment of the method for fabricating a stacked capacitor having increased surface area on a DRAM cell. The DRAM cells having these types of capacitors are typically formed on a P-doped semiconductor substrates using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip. For example, by forming N-well regions in the P doped substrate, P-channel FETs can also be provided from which Complementary Metal-Oxide-Semiconductor (CMOS) circuits can also be formed, such as are used for the peripheral circuits on the DRAM chip.

Figure 1:
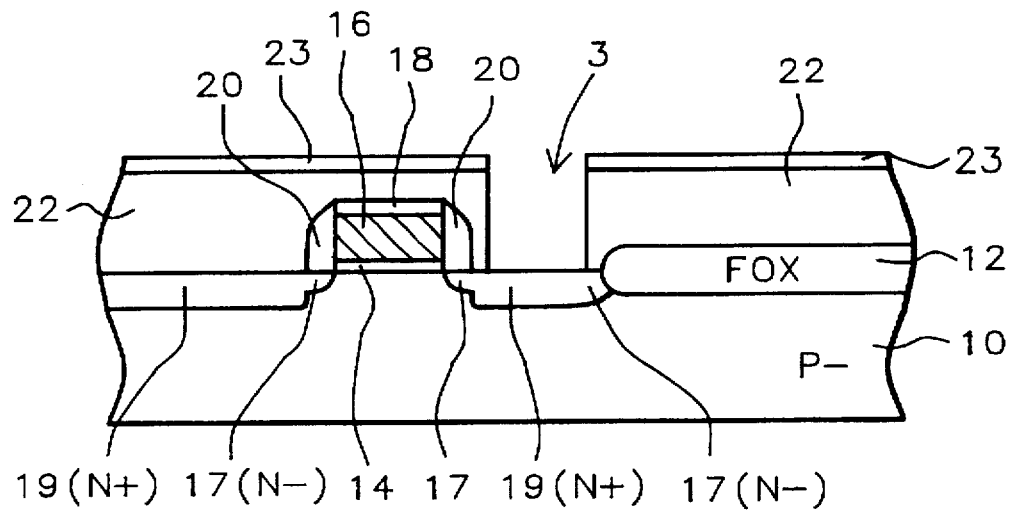

Referring first to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P-type single crystal silicon having preferably a <100> crystallographic orientation. A relatively thick Field OXide (FOX) 12 is formed surrounding and electrically isolating the individual device regions in which the memory cells are built. The field oxide 12, only partially shown in FIG. 1, is most commonly formed by the LOCal Oxidation of Silicon (LOCOS) method. Briefly the LOCOS method involves depositing a thin silicon oxide (pad oxide) and a thicker silicon nitride (Si3N4) layer as an oxidation barrier layer on the substrate surface (not shown in FIG. 1), and using conventional photolithographic techniques and etching to remove the barrier layer in areas where a field oxide is desired, while retaining the silicon nitride in areas where active devices are to be fabricated. The silicon substrate is then subjected to a thermal oxidation to form the field oxide areas 12. The oxide is usually grown to a thickness in the range of between about 3000 and 6000 Angstroms.

The array of pass transistors (N-FETs) is now formed in the active device regions after removing the silicon nitride barrier layer and pad oxide in a wet etch. For example, the nitride can be removed in a hot phosphoric acid (H3PO4) etch at about 180° C., and the pad oxide can be removed in a dilute solution of hydrofluoric acid and water (HF/H2O). The gate oxide for the N-FETs is formed next in the device areas by thermally oxidizing the active device regions to form a thin gate oxide 14, as shown in FIG. 1. Typically, the thickness of the gate oxide 14 is between about 50 and 150 Angstroms.

Referring still to FIG. 1, the FET gate electrodes in the device areas and the interconnecting word lines on the field oxide 12 are formed next by patterning a polycide layer 16. Preferably the polycide layer 16 is formed by first depositing a polysilicon layer by low pressure chemical vapor deposition (LPCVD) using, for example, a reactant gas such as silane (SiH4), and is typically N+ doped with arsenic or phosphorus to a concentration of between about 1.0 E 19 and 1.0 E 21 atoms/cm3 and is preferably deposited to a thickness of between about 1000 and 2000 Angstroms. The polycide layer 16 is then completed by depositing a tungsten silicide (WSi2) layer, for example, by CVD using a reactant gas such as tungsten hexafluoride (WF6). Typically, the WSi2 is deposited to a thickness of between about 500 and 1500 Angstroms. Prior to patterning the silicide layer, a cap oxide 18 is deposited on layer 16. The cap oxide 18, usually composed of silicon oxide (SiO2), is also deposited using LPCVD by decomposing a reactant gas, such a tetraethosiloxane (TEOS), and is provided over the silicide to electrically insulate the gate electrodes from the bit lines that are formed at a later process step that is not described in this embodiment. Typically, the thickness of the cap oxide layer 18 is between about 600 and 2000 Angstroms. Conventional photolithographic techniques and anisotropic plasma etching are then used to pattern the gate electrodes 16, as shown in FIG. 1.

Lightly doped source/drain areas 17 are next formed adjacent to the gate electrodes 16. The lightly doped source and drain areas 17 for the N-FETs are formed by ion implantation of an N-type dopant, such as arsenic or phosphorus. For example, a typical implant might consist of phosphorus P31 at a dose of between 1.0 E 13 and 1.0 E 14 atoms/cm2 and at an energy of between about 30 and 80 KeV. The gate electrodes serve as an implant mask to self-align the lightly doped source/drain areas 17 to the electrodes, while an additional photoresist mask can be used to avoid unwanted implants elsewhere on the substrate.

After forming the lightly doped source/drain 17, sidewall spacers 20 are formed on the sidewalls of the gate electrode 16, also shown in FIG. 1. These sidewall spacers are typically formed by depositing a low-temperature silicon oxide, and then anisotropically etching back to the silicon surface of the substrate 10. For example, the sidewall oxide can be deposited using LPCVD and tetraethoxysilane (TEOS) at a temperature in the range of about 650° to 900° C. and the etch back performed in a low pressure reactive ion etcher. An N+ source/drain ion implantation is then used to complete the source/drain areas forming the N+ doped source/drain contact areas 19 aligned to the sidewall spacers 20 and therefore also aligned to the lightly doped source/drain areas 17, as are also depicted in FIG. 1. A first insulating layer 22 is deposited using LPCVD and a reactant gas such as TEOS to form a silicon oxide layer to electrically insulate the underlying FETs including the exposed source/drain contact areas 19. The preferred thickness of layer 22 is between about 3000 and 8000 Angstroms. Layer 22 is then planarized, for example, by chemical/mechanical polishing. A silicon nitride (Si3N4) layer 23 is then deposited on the first insulating layer 22 that later serves as an etch stop layer. The silicon nitride is preferably deposited by LPCVD using a reactant gas mixture, such as dichlorosilane (SiCl2H2) and ammonia (NH3) to a thickness of between about 200 and 600 Angstroms.

Still referring to FIG. 1, node contact openings 3 are etched in the silicon nitride layer 23 and the first insulating layer 22 to one of the two source/drain contact areas 19 of each FET in the array of memory cells where node contacts for the stacked capacitor are desired. Only one DRAM cell area and one node contact opening 3 are shown in FIG. 1. The node contact openings can be etched by using a high-density plasma etcher and a reactant gas mixture such as trifluoromethane (CHF3), oxygen (O2) and argon (Ar).

Figure 2:
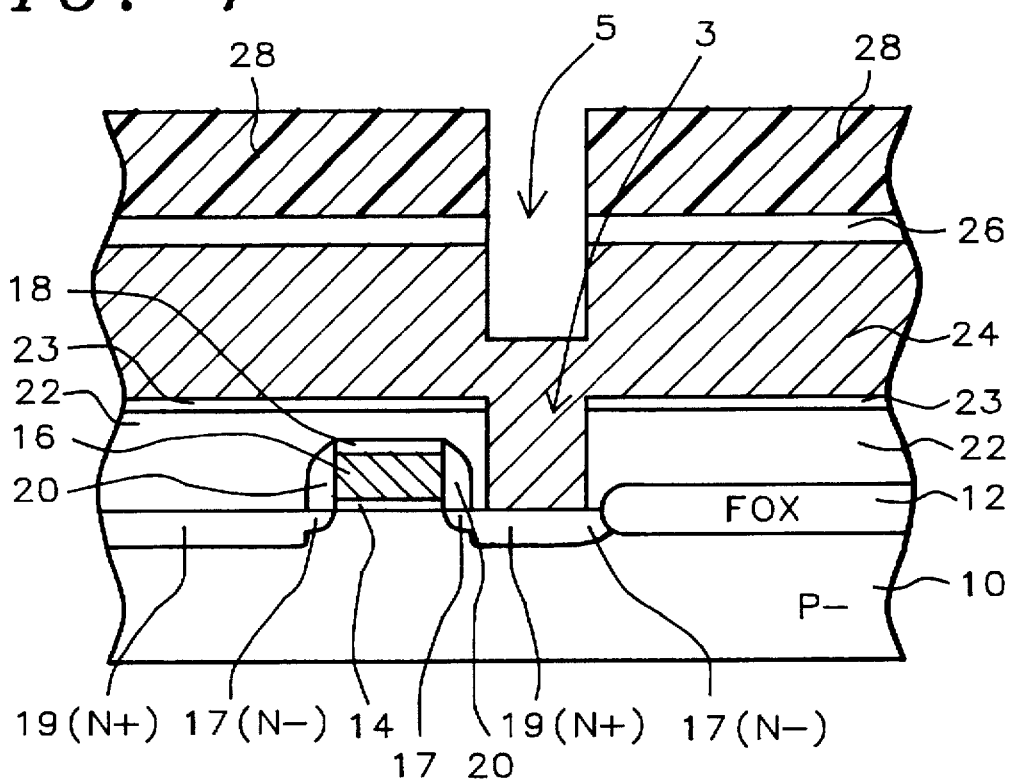

Referring now to FIG. 2, stacked capacitors are now formed by first depositing a relatively thick first polysilicon layer 24. Preferably layer 24 is deposited using LPCVD and a reactant gas such as SiH4. Polysilicon layer 24 is doped with an N-type dopant, such as with phosphorus to a concentration of between about 1.0 E 19 and 1.0 E 21 atoms/cm3. For example, layer 24 can be doped by implanting P31 ions, or alternatively layer 24 can be doped in situ during the LPCVD by adding a dopant gas such as phosphine (PH3). The preferred thickness of layer 24 is between about 2000 and 6000 Angstroms. The portion of polysilicon layer 24 in the node contact openings 3 forms the node contacts providing good (ohmic) electrical contact to the N+ doped source/drain contact areas 19.

A second insulating layer 26 is deposited on the first polysilicon layer 24. Layer 26 is preferably composed of silicon nitride (Si3N4) and is deposited by CVD using as the reactant gases, for example, dichlorosilane (SiCl2H2) and ammonia (NH3), and has a thickness of between about 500 and 1000 Angstroms. Layer 26 provides an oxidation barrier layer over layer 24 that is later used during a thermal oxidation step.

A first photoresist masking layer 28 is then deposited by spin coating, and using conventional photolithographic techniques is patterned providing openings in the photoresist layer over the node contact openings 3 in the first insulating layer 22. To provide a capacitor occupying the least area and therefore the highest packing density, the openings in the photoresist can be made with minimum feature sizes using the current photoresist resolution limit. Anisotropic plasma etching is then used to form openings in the second insulating layer 26 composed of silicon nitride, and the etching is continued to form recesses (trenches) 5 in the first polysilicon layer 24 over the node contact openings 3. Preferably the etching is carried out using reactive ion etching using an etchant gas such as trifluoromethane (CHF3), oxygen (O2), and argon (Ar). The recesses 5 have essentially vertical sidewalls, and are etched to a depth of between about 1000 and 5000 Angstroms.

Figure 3:
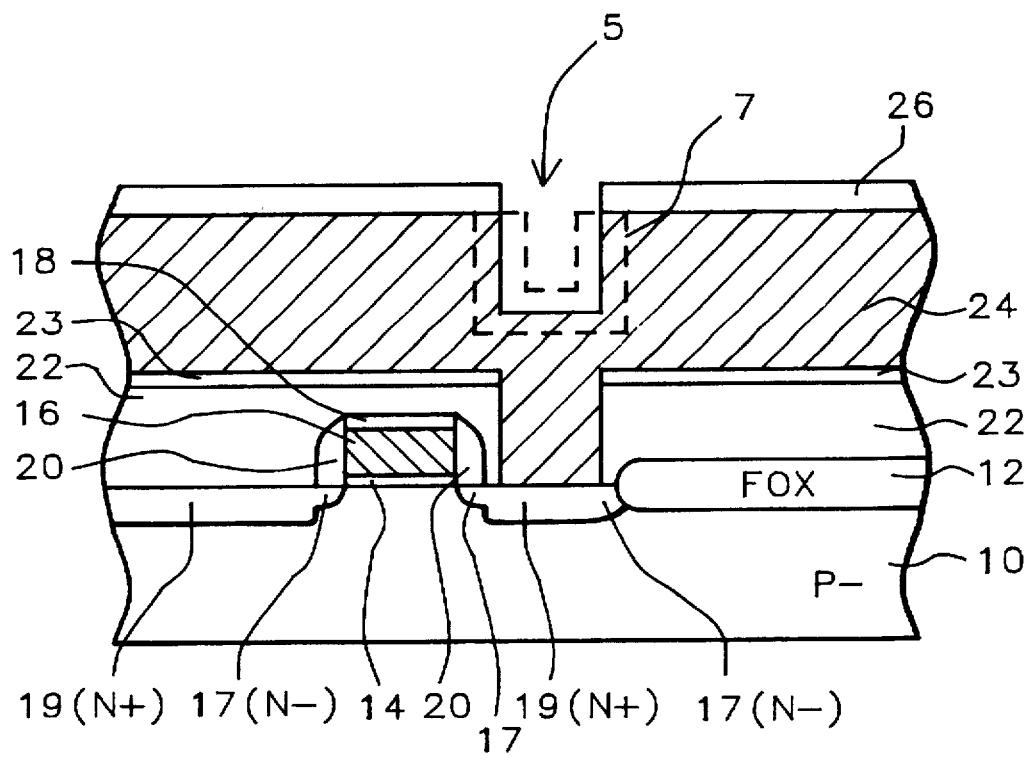
Figure 4:
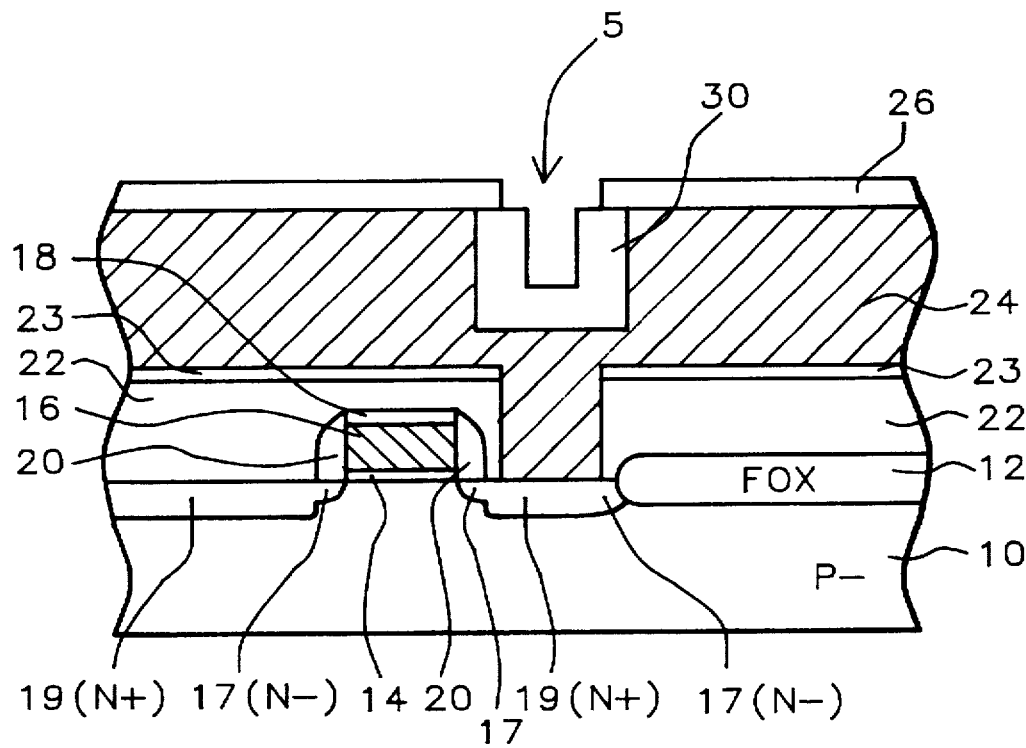

After the recesses 5 are etched, the photoresist 28 is stripped as shown in FIG. 3, and as also shown in FIG. 3 by the dotted outline 7, the recesses are thermally oxidized to form a polysilicon oxide 30, as depicted in FIG. 4. The second insulating (silicon nitride) layer 26 serves as an oxidation barrier layer during oxidation to prevent the oxidation of the top surface of the first polysilicon layer 24. Preferably the thermal oxidation is carried out in an oxidation furnace using, for example, steam (wet) oxidation. For example, the oxidation can be carried out in a temperature range of between about 700° and 900° C. Preferably the polysilicon oxide 30 on layer 24 is grown to a thickness of between about 800 and 2000 Angstroms. During thermal oxidation the opening 5 is further reduced in width due to the expansion of the polysilicon oxide layer into the recessed area 5.

Figure 5:
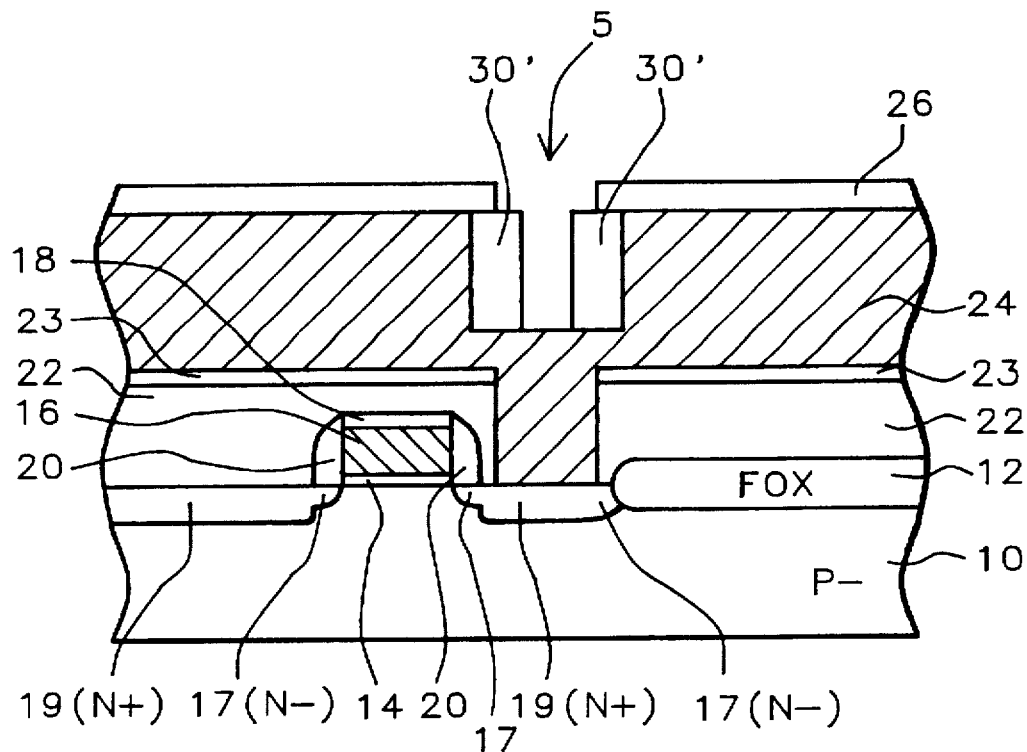

Referring to FIG. 5, the polysilicon oxide layer 30 on the bottom surface in the recessed area 5 is removed by anisotropic plasma etching, thereby exposing the first polysilicon layer 24. For example, the etching can be carried out using magnetically enhanced reactive ion etching (MERIE) using an etchant gas such as trifluoromethane (CHF3), which has a high etch selectivity of silicon oxide to polysilicon. This results in polysilicon oxide sidewall spacers 30' remaining on the sidewalls of the recesses 5 that will later serve to self-align a polysilicon stud formed in the recesses to the sidewalls of the first polysilicon layer 24 in the recesses 5.

Referring now to FIG. 6, the second insulating layer (silicon nitride) layer 26 is selectively removed in a hot phosphoric acid etch. A conformal second polysilicon layer 32 is deposited over the first polysilicon layer 24 and into the recesses 5 having the sidewall spacers 30' on the sidewalls. For example, layer 32 can be deposited in a manner similar to the deposition of the first polysilicon layer using LPCVD and in situ doped using phosphine (PH3). Preferably layer 32 is doped with phosphorus to a concentration of between about 1.0 E 19 and 1.0 E 21 atoms/cm3, and is deposited to a thickness sufficient to completely fill the recessed areas surrounded by the polysilicon oxide sidewall spacers 30', and more specifically to a thickness of between about 800 and 2000 Angstroms.

Now referring to FIG. 7, the second polysilicon layer 32 is polished back to the surface of the first polysilicon layer 24, as depicted by the vertical arrows 9, thereby exposing the top surface of the sidewall spacers 30'. Preferably the polishing is achieved by chemical/mechanical polishing using appropriate polishing equipment and a slurry. The remaining portion of the second polysilicon layer 32 in the recesses 5 forms polysilicon studs 32' which are self-aligned to the sidewalls in the recesses of the first polysilicon layer 24 by means of the sidewall spacers 30'.

Referring now to FIG. 8A, conventional photolithographic techniques are used to spin coat and pattern a second photoresist layer 34 to define the bottom electrodes of the stacked capacitors. The patterned second photoresist layer 34 is aligned over the recessed area 5 having the polysilicon oxide sidewall spacers 30' and the studs 32'. The outer perimeter of the patterned photoresist defines the outer perimeter of the bottom electrodes for the stacked capacitors.

Figure 9:
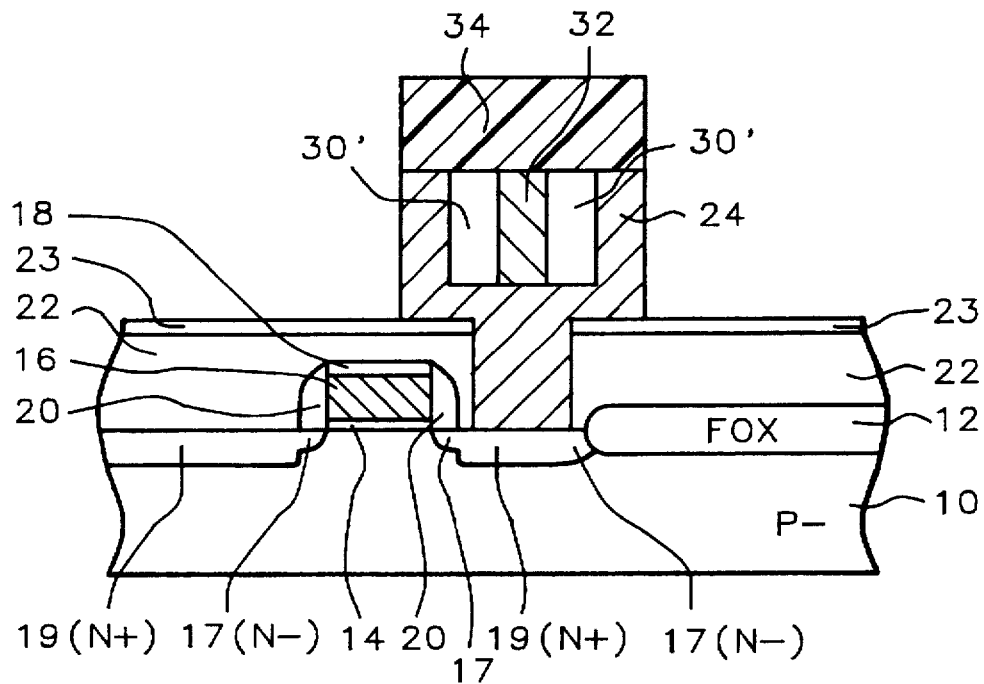

Referring now to FIG. 9, using the patterned photoresist layer 34 as an etch mask, the first polysilicon layer 24 is anisotropically plasma etched to the silicon nitride layer 23 on the first insulating layer 22, thereby forming the array of bottom electrodes for the stacked capacitors. The patterning of layer 24 can preferably be carried out in a reactive ion etcher or high-density plasma etcher using an etchant gas mixture that has a high etch selectivity of polysilicon to oxide, such as hydrogen bromide (HBr) and chlorine (Cl2) or a gas mixture of HBr, sulfur hexafluoride (SF6), and O2.

Figure 10:
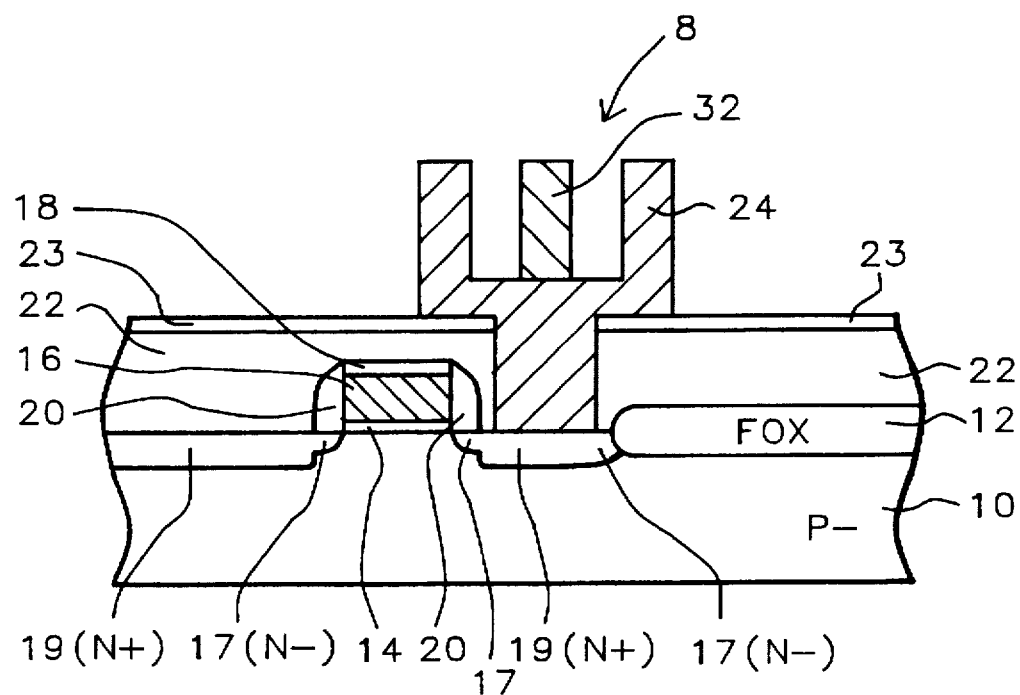

Now as shown in FIG. 10, the second photoresist layer 34 is removed, for example by plasma ashing in oxygen, and the insulating sidewall spacers 30' formed by the thermally grown polysilicon oxide are then selectively removed using a hydrofluoric (HF) acid etch, thereby forming an array of bottom electrodes having vertical portions formed from the first polysilicon layer 24 and studs formed from the second polysilicon layer 32. Only one of the capacitor bottom electrodes 8 of the array of bottom electrodes is depicted in FIG. 10. During the etching of the sidewall spacer 30', the silicon nitride layer 23 serves as an etch stop to prevent erosion of the underlying first insulating layer 22.

Figure 11:
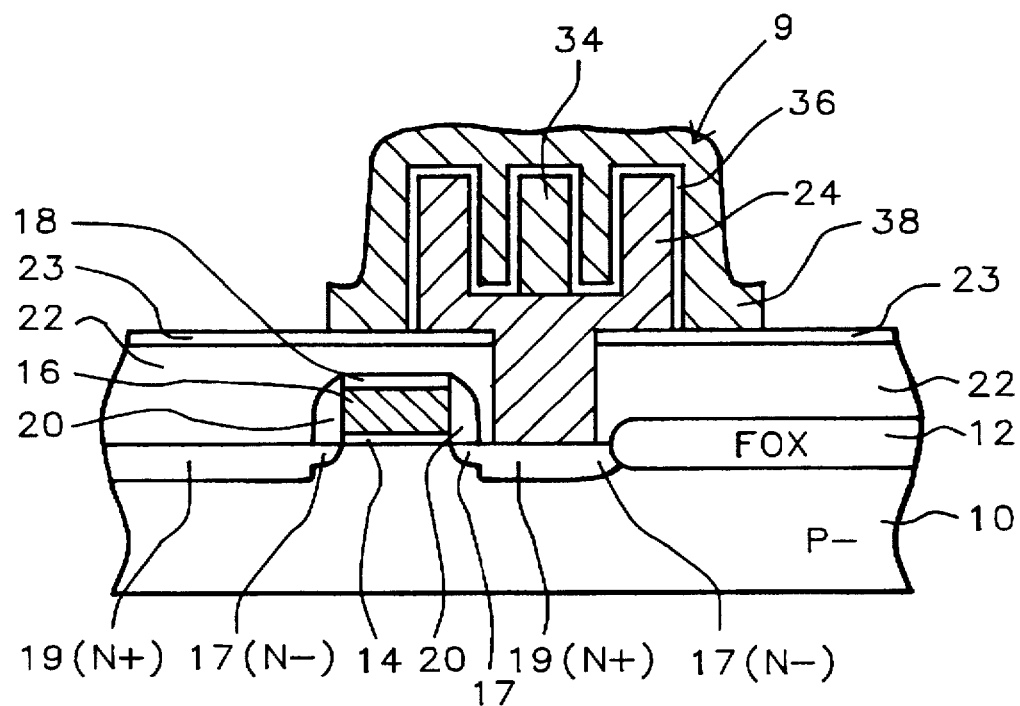

Referring now to FIG. 11, the array of DRAM stacked storage capacitors having this increased surface area is now completed. The process involves forming a capacitor interelectrode dielectric layer 36 on the surface of the capacitor bottom electrode 8 composed of the stud 32 formed from the patterned second polysilicon layer 24. The dielectric layer 36 is preferably composed of silicon oxide and silicon nitride (ON). Alternatively, the dielectric can be composed of a multilayer of silicon oxide, silicon nitride, and silicon oxide (ONO). For example, the dielectric layer 36 composed of silicon oxide-silicon nitride-silicon oxide (ONO) is formed by first thermally oxidizing the polysilicon bottom electrode 8. A low pressure chemical vapor deposition (LPCVD) and a reactive gas mixture of ammonia (NH3) and dichlorosilane (SiCl2H2) is used to deposit the silicon nitride layer that is then exposed to a wet oxygen, for example, at a temperature of about 850° C. for about 10 minutes to partially convert the silicon nitride to an oxide. The preferred total thickness of the interelectrode dielectric layer 36 is between about 30 and 100 Angstroms. In addition, other commonly practiced methods can be used to further increase the capacitance, such as roughing the electrode surface and by using interelectrode materials having higher dielectric constants, such as tantalum pentoxide (Ta2O5). A third polysilicon layer 38 is deposited on the interelectrode dielectric layer 36. Layer 38 conformally covers the bottom electrode and forms the top electrode for the stacked storage capacitors. Layer 38 is preferably deposited by LPCVD and is in-situ doped N-type. The preferred thickness of polysilicon layer 38 is between about 1000 and 2000 Angstroms and is doped with an N-type dopant impurity, such as with phosphorus (P). The preferred concentration of phosphorus in layer 38 is in the range of between about 5.0 E 19 and 1.0 E 21 atoms/cm3. The polysilicon layer 38 is then patterned using conventional photolithographic techniques and plasma etching to form the top electrodes and complete the array of stacked storage capacitors having increased capacitance. Only one of the capacitors of the array is depicted in FIG. 11.

Figure 8B:
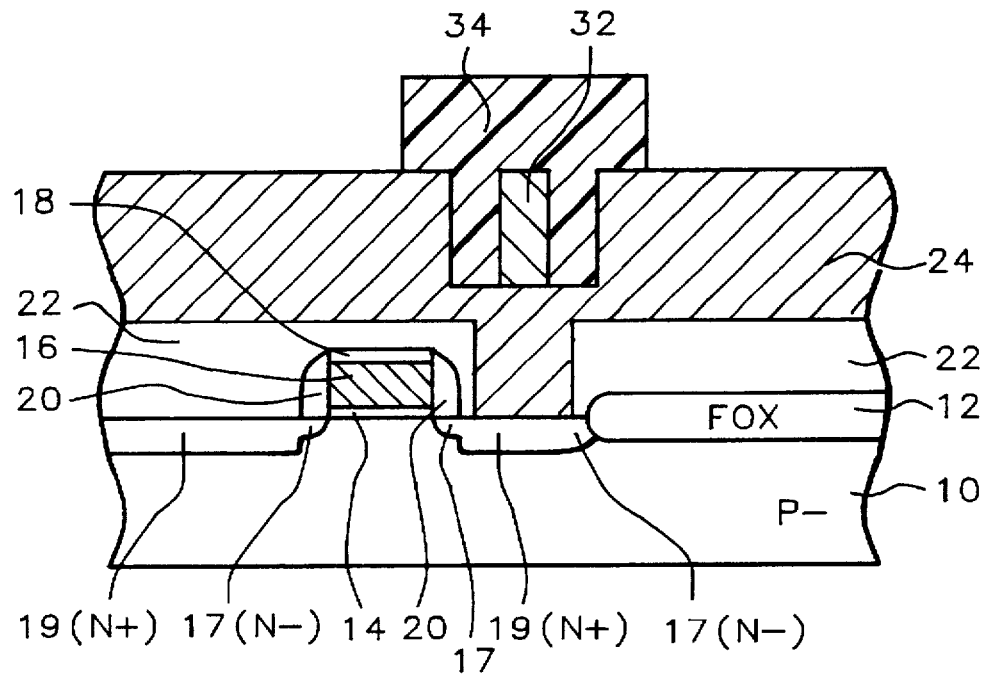

Referring now to FIG. 8B, a second embodiment of the invention is described. The method for making the stacked capacitors is similar to the first embodiment therefore all the elements of the structure are similarly numbered. The process of the second embodiment however does not require the silicon nitride layer 23 as an etch stop layer and therefore is not shown in FIG. 8B. In the second embodiment the polysilicon oxide spacers 30' are removed by etching in the hydrofluoric acid before patterning the capacitor bottom electrodes from the first polysilicon layer 24. Therefore, the silicon nitride layer 23 (FIG. 8A) on the silicon oxide layer 22 is not required as an etch stop layer to prevent the etching of the underlying first insulating 22. The second patterned photoresist layer 34 is formed over the recessed areas and in the voids formed by the removal of the spacers 30' (FIG. 8B). Anisotropic plasma etching is then carried out to define the bottom electrodes in layer 24 and the second photoresist 34 is stripped to provide bottom electrodes as shown in FIG. 10, except that layer 23 in FIG. 10 is not required. The interelectrode dielectric layer 36 and the top electrode 38 are then formed in accordance with the method of the first embodiment as shown in FIG. 11. Since the first polysilicon layer 24 (FIG. 8B) serves as the etch stop layer, the deposition of the silicon nitride layer 23 is eliminated reducing the number of processing steps.

While the invention has been particularly shown and described with reference to the preferred embodiment thereof, it will be understood by those skilled in the art that various changes in form and details may be made without departing from the spirit and scope of the invention.

What is claimed is:

1. A method for fabricating stacked storage capacitors with bottom electrodes having increased surface areas formed on semiconductor substrates comprising the steps of:

providing the semiconductor substrate having device areas surrounded and electrically isolated from each other by field oxide areas, said device areas having semiconductor devices formed, in part, from a patterned polycide layer, and having device contact areas in said device areas;

depositing a first insulating layer over said device areas and elsewhere on said substrate;

planarizing said first insulating layer;

depositing a silicon nitride layer;

etching node contact openings in said silicon nitride layer and said first insulating layer to said device contact areas;

depositing a first polysilicon layer on said first insulating layer and in said node contact openings thereby forming node contacts for said stacked storage capacitors;

depositing a second insulating layer composed of silicon nitride on said first polysilicon layer;

forming a patterned first photoresist masking layer and anisotropic plasma etching to form openings in said second insulating layer and further forming recessed areas in said first polysilicon layer in said openings over said node contact openings;

thermally oxidizing said first polysilicon layer exposed in said recessed areas thereby forming a polysilicon oxide on sidewalls and bottom surfaces of said recessed areas;

selectively removing by etching said second insulating layer composed of said silicon nitride;

anisotropic plasma etching said polysilicon oxide on said bottom surfaces of said recessed areas, thereby forming polysilicon oxide sidewall spacers;

depositing a conformal second polysilicon layer and filling said recessed areas in said first polysilicon layer;

chemical/mechanical polishing said second polysilicon layer to said first polysilicon layer thereby forming polysilicon studs in said recessed areas;

forming a patterned second photoresist masking layer having portions aligned over said polysilicon oxide sidewall spacers and defining outer perimeters of said bottom electrodes over said first polysilicon layer;

anisotropic plasma etching said first polysilicon layer to said silicon nitride layer on said first insulating layer;

selectively etching said sidewall spacers and thereby forming said bottom electrodes having vertical portions formed from said first and second polysilicon layers;

forming an interelectrode dielectric layer on said bottom electrodes;

depositing a third polysilicon layer;

patterning said third polysilicon layer and forming top electrodes thereby completing said stacked storage capacitors.

2. The method of claim 1, wherein said polycide layer is conductively doped N+ and patterned to form gate electrodes for field effect transistors.

3. The method of claim 1, wherein said first insulating layer is a chemical vapor deposited silicon oxide having a thickness of between about 3000 and 8000 Angstroms.

4. The method of claim 1, wherein said first insulating layer is planarized by chemical/mechanical polishing.

5. The method of claim 1, wherein said first polysilicon layer is between about 2000 and 6000 Angstroms thick and is conductively doped N+ with phosphorus.

6. The method of claim 1, wherein said second insulating layer composed of silicon nitride has a thickness of between about 500 and 1000 Angstroms.

7. The method of claim 1, wherein said recessed areas in said first polysilicon layer are etched to a depth of between about 1000 and 5000 Angstroms.

8. The method of claim 1, wherein said openings in said second insulating layer composed of silicon nitride are minimum feature sizes of a current photolithography.

9. The method of claim 1, wherein said polysilicon oxide sidewall spacers have a thickness of between about 800 and 2000 Angstroms.

10. The method of claim 1, wherein said second insulating layer composed of silicon nitride is removed in a hot phosphoric acid solution.

11. A method for fabricating stacked storage capacitors with bottom electrodes having increased surface areas formed on semiconductor substrates comprising the steps of:

providing said semiconductor substrate having device areas surrounded and electrically isolated from each other by field oxide areas, said device areas having semiconductor devices formed, in part, from a patterned polycide layer, and having device contact areas in said device areas;

depositing a first insulating layer over said device areas and elsewhere on said substrate;

planarizing said first insulating layer;

etching node contact openings in said first insulating layer to said device contact areas;

depositing a first polysilicon layer on said first insulating layer and in said node contact openings thereby forming node contacts for said stacked storage capacitors;

depositing a second insulating layer composed of silicon nitride on said first polysilicon layer;

forming a patterned first photoresist masking layer and anisotropic plasma etching to form openings in said second insulating layer and further forming recessed areas in said first polysilicon layer in said openings over said node contact openings;

thermally oxidizing said first polysilicon layer exposed in said recessed areas thereby forming a polysilicon oxide on sidewalls and bottom surfaces of said recessed areas;

selectively removing by etching said second insulating layer composed of said silicon nitride;

anisotropic plasma etching said polysilicon oxide on said bottom surfaces of said recessed areas, thereby forming polysilicon oxide sidewall spacers;

depositing a conformal second polysilicon layer and filling said recessed areas in said first polysilicon layer;

chemical/mechanical polishing said second polysilicon layer to said first polysilicon layer thereby forming polysilicon studs in said recessed areas;

selectively etching said sidewall spacers and thereby forming trenches between said studs formed from said second polysilicon layer and said first polysilicon layer;

forming a patterned second photoresist masking layer having portions aligned over said trenches and perimeters of said second photoresist masking layer defining outer perimeters of said bottom electrodes over said first polysilicon layer;

anisotropic plasma etching said first polysilicon layer to said first insulating layer thereby forming said bottom electrodes having vertical portions formed from said first and second polysilicon layers;

forming an interelectrode dielectric layer on said bottom electrodes;

depositing a third polysilicon layer;

patterning said third polysilicon layer and forming top electrodes thereby completing said stacked storage capacitors.

12. The method of claim 11, wherein said polycide layer is conductively doped N+ and patterned to form gate electrodes for field effect transistors.

13. The method of claim 11, wherein said first insulating layer is a chemical vapor deposited silicon oxide having a thickness of between about 3000 and 8000 Angstroms.

14. The method of claim 11, wherein said first insulating layer is planarized by chemical/mechanical polishing.

15. The method of claim 11, wherein said first polysilicon layer is between about 2000 and 6000 Angstroms thick and is conductively doped N+ with phosphorus.

16. The method of claim 11, wherein said second insulating layer composed of silicon nitride has a thickness of between about 500 and 1000 Angstroms.

17. The method of claim 11, wherein said recessed areas in said first polysilicon layer are etched to a depth of between about 1000 and 5000 Angstroms.

18. The method of claim 11, wherein said openings in said second insulating layer are minimum feature sizes of a current photolithography.

19. The method of claim 11, wherein said polysilicon oxide sidewall spacers have a thickness of between about 800 and 2000 Angstroms.

20. The method of claim 11, wherein said second insulating layer composed of silicon nitride is removed in a hot phosphoric acid solution.

21. The method of claim 11, wherein said patterned polycide layer is used to form gate electrodes for field effect transistors that serve as switching transistors in dynamic random access memory cells, and said stacked storage capacitors are electrically connected by said node contacts to one source/drain contact area of each said field effect transistors.

* * * * *